United States Patent
Rahman et al.

(10) Patent No.: US 11,226,371 B2
(45) Date of Patent: Jan. 18, 2022

(54) SYSTEM AND METHOD OF PRODUCTION TESTING OF IMPEDANCE OF RADIO FREQUENCY CIRCUIT INCORPORATED ON PRINTED CIRCUIT BOARD

(71) Applicant: Silicon Laboratories Inc., Austin, TX (US)

(72) Inventors: Yuwono Kurnia Rahman, Singapore (SG); Pasi Rahikkala, Vihti (FI); Kian Jin Chua, Singapore (SG); Zhiyuan Guan, Singapore (SG); Wei Jue Lim, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 137 days.

(21) Appl. No.: 16/685,450

(22) Filed: Nov. 15, 2019

(65) Prior Publication Data
US 2021/0148973 A1 May 20, 2021

(51) Int. Cl.
*G01R 31/304* (2006.01)
*G01R 27/06* (2006.01)
*G01R 31/303* (2006.01)

(52) U.S. Cl.
CPC .......... *G01R 31/304* (2013.01); *G01R 27/06* (2013.01); *G01R 31/303* (2013.01)

(58) Field of Classification Search
CPC .... G01R 31/30; G01R 31/304; G01R 31/303; G01R 31/11; G01R 31/28; G01R 27/00; G01R 27/02; G01R 27/06
See application file for complete search history.

(56) References Cited

U.S. PATENT DOCUMENTS

| | | | | |
|---|---|---|---|---|
| 5,548,538 A | * | 8/1996 | Grace | .................... G01R 27/28 324/605 |
| 2012/0319697 A1 | * | 12/2012 | Gregg | ................ G01R 31/2822 324/511 |
| 2013/0271328 A1 | * | 10/2013 | Nickel | .................... G01R 29/10 343/703 |

(Continued)

OTHER PUBLICATIONS

LF-2.7 GHz RF/IF Gain and Phase Detector. Analog Devices Data Sheet, AD8302. Rev.B Apr. 2018 www.analogdevices.com pp. 1-23.

(Continued)

*Primary Examiner* — Son T Le
(74) *Attorney, Agent, or Firm* — Gary Stanford (57) ABSTRACT

A test system for testing RF PCBs including an RF probe for interfacing an intermediate node of each RF PCB, an RF source providing an RF test signal, a reflectometer, and a test measurement system that makes a pass/fail determination of each RF PCB using a measured reflection coefficient. Each RF PCB includes an IC matching circuit and an antenna matching circuit coupled between an RFIC and an antenna, in which the intermediate RF node is between the matching circuits. The reflectometer outputs a measured reflection coefficient indicative of a comparison between a reflected RF signal and the RF test signal. The measured reflection coefficient may be corrected using error values based on a calibration procedure using a calibration kit with modified RF PCBs with known loads. The modified RF PCBs are measured with a network analyzer and the test system to calculate the error values used for production testing.

16 Claims, 5 Drawing Sheets

TEST SYSTEM 102

(56) References Cited

U.S. PATENT DOCUMENTS

2015/0180593 A1* 6/2015 Hamilton ................ H03F 1/565
    455/107

OTHER PUBLICATIONS

Bi-Directional Coupler. *High Power* Data Sheet, BDCN-14-342+ Rev. B. Mini-Circuits® Brooklyn, NY. Jun. 1, 2015 www.minicircuits. com p. 1.

* cited by examiner

FIG. 3 (SHORT CIRCUIT)

FIG. 4 (OPEN CIRCUIT)

FIG. 5 (LOADED CIRCUIT)

SYSTEM AND METHOD OF PRODUCTION TESTING OF IMPEDANCE OF RADIO FREQUENCY CIRCUIT INCORPORATED ON PRINTED CIRCUIT BOARD

BACKGROUND OF THE INVENTION

Field of the Invention

The present invention relates in general to production testing of printed circuit boards, and more particularly to production testing of impedance of a radio frequency circuit incorporated on a printed circuit board.

Description of the Related Art

A radio frequency (RF) circuit may be incorporated on a printed circuit board (PCB) or the like of an RF transmitter, receiver or transceiver. The PCB mounts communication circuitry along with an antenna for sending and/or receiving RF signals. In many configurations, an RF front end and digital circuitry portions are incorporated on a separate RF integrated circuit (RFIC), which is mounted on the PCB. A crystal (XTAL) may also be provided and interfaced with the RFIC to form a crystal oscillator for generating a requisite frequency reference for enabling RF communications. Many such RF communications are in the 2.4 Gigahertz (GHz) frequency range, although alternative frequency ranges are contemplated. The RF circuitry may also include tuning circuitry or the like for matching impedances between the RFIC and the antenna. The tuning circuitry is referred to herein as matching circuitry since tuned for matching desired impedance level for RF communications.

Each PCB should be tested during the manufacturing process prior to shipping. It is noted that the RFIC may be separately tested prior to mounting on the RF PCB. Conventional testing of the RF PCB involved radiated testing, in which the RF matching circuitry and the antenna were the primary focus of radiated testing. In a conventional configuration, the RF PCB was mounted to the test equipment and placed into a radiated mode for sending and receiving RF signals with the tester through a transmission medium, such as the open air. The antenna, however, operated as a near-field mode and was very sensitive to the surroundings, which made the measurements less repeatable. The radiated testing was not sensitive to value changes of the matching circuits since it has minimal impact on transmit power or received signal strength indicator (RSSI) compared to part-to-part variations. Thus, radiated tests were not repeatable, did not reliably detect antenna issues, and also did not accurately detect matching problems of the matching circuits.

A vector network analyzer (VNA) or a scalar network analyzer (SNA) may be used for testing. Network analyzer equipment, however, is very expensive and not practicable for mass production testing of mass-produced RF PCBs (e.g., hundreds of thousands or even millions of units). In particular, a network analyzer is a general purpose piece of equipment that requires a slow and manual process for setup that is only suitable for laboratory work. In addition, the calibration of a network analyzer is not designed to remove measurement error on a mass production setup.

SUMMARY OF THE INVENTION

A test system for testing a radio frequency (RF) printed circuit board (PCB) according to one embodiment includes an RF probe for electrically interfacing an intermediate node of the RF PCB, an RF source providing at least one RF test signal, a reflectometer, and a test measurement system that makes a pass/fail determination of the RF PCB using a measured reflection coefficient. The RF PCB includes an RF integrated circuit (RFIC), an IC matching circuit coupled between the RFIC and the intermediate node, and an antenna matching circuit coupled between the intermediate node and an antenna. The reflectometer transfers the RF test signal to the intermediate node via the RF probe, detects a reflected RF signal from the RF probe, and outputs the measured reflection coefficient indicative of a comparison between the reflected RF signal and the RF test signal.

In one embodiment, the reflectometer includes a bidirectional coupler and a gain/phase detector. The bidirectional coupler delivers RF power from the RF source to the RF probe and that provides a forward power signal indicative of the RF test signal and a reflected power signal indicative of the reflected RF signal. The gain/phase detector provides the measured reflection coefficient as a magnitude value indicative of a power ratio of the reflected power signal and the forward power signal and a phase value indicative of a phase differential between the forward and reflected signals.

The test measurement system may use at least one error value to convert the measured reflection coefficient into an actual reflection coefficient in which it uses the actual reflection coefficient to make the pass/fail determination. The test measurement system may convert the actual reflection coefficient into an impedance vector including a resistance value and a reactance value. In this case, the test measurement system makes the pass/fail determination by comparing the resistance value with an allowable resistance range and by comparing the reactance value with an allowable reactance range.

The RF source may provide multiple forward RF signals at different frequencies for providing corresponding measurement reflection coefficients. In this case, the test measurement system may use at least one error value for each of the different frequencies to convert the measured reflection coefficients into actual reflection coefficients, and then may use the actual reflection coefficients to make the pass/fail determination.

The at least one error value may actually be multiple error values that are determined for each of the different frequencies. The error values may be determined by a calibration procedure based on measurements taken for each of multiple test PCBs with known load conditions. In one embodiment, the test PCBs may include a first test PCB with short circuit load, a second test PCB with an open circuit load, and a third test PCB with a predetermined resistive load. Each of the test PCBs may be measured by a network analyzer at each of a set of frequencies including the different frequencies to determine a corresponding set of reference reflection coefficients for each test PCBs. The test PCBs are also measured by the test system at a subset of the same set of frequencies to determine a corresponding set of test reflection coefficients for each test PCBs. In this case, multiple error values are determined for each of the different frequencies using the set of reference reflection coefficients and the set of test reflection coefficients.

The test measurement system may use at least one error value for each of the different frequencies to convert the measured reflection coefficients into corresponding actual reflection coefficients, in which case the test measurement system may convert each actual reflection coefficient into a corresponding impedance vector which is used to make the pass/fail determination. Each impedance vector may include a resistance component and a reactive component. The test measurement system makes the pass/fail determination by comparing each resistance component with a corresponding allowable resistance range and by comparing each reactance component with a corresponding allowable reactance range.

A method of testing the RF PCB according to one embodiment includes electrically interfacing the intermediate node of the RF PCB using an RF probe, applying at least one RF test signal to the intermediate node via the RF probe, detecting a reflected RF signal from the RF PCB, providing a measured reflection coefficient indicative of a comparison between the reflected RF signal and the RF test signal, and making a pass/fail determination of the RF PCB using the measured reflection coefficient.

The method may include providing a magnitude value indicative of a ratio of the reflected RF signal and the RF test signal and providing a phase value indicative of a phase between the RF test signal and the reflected RF signal. The method may include converting the measured reflection coefficient into an actual reflection coefficient using at least one error value, and using the actual reflection coefficient to make the pass/fail determination. The method may include converting the actual reflection coefficient into an impedance vector including a resistance value and a reactance value, and comparing the resistance value with an allowable resistance range and comparing the reactance value with an allowable reactance range for making the pass/fail determination.

The method may include applying multiple RF test signals at different frequencies for providing corresponding measurement reflection coefficients, converting the measured reflection coefficients into corresponding actual reflection coefficients using at least one error value for each of the different frequencies, and making the pass/fail determination using the actual reflection coefficients. The method may include performing a calibration procedure by taking measurements of each of multiple test PCBs with known load conditions to determine multiple error values for each of the different frequencies. The test PCBs may include, for example, first test PCB with a short circuit load, a second test PCB with an open circuit load, and a third test PCB with a predetermined resistive load.

The method may include measuring each test PCB at each of a set of frequencies including the different frequencies previously described using a network analyzer to determine a corresponding set of reference reflection coefficients for each test PCB, testing each test PCB to provide a corresponding set of test reflection coefficients for each test PCB, and determining the error values for each of the different frequencies using the set of reference reflection coefficients the set of test reflection coefficients.

The method may include applying multiple RF test signals at different frequencies for providing corresponding measurement reflection coefficients, converting the measured reflection coefficients into corresponding actual reflection coefficients using at least one error value for each of the different frequencies, converting each of the actual reflection coefficients into a corresponding one of multiple impedance vectors, and making the pass/fail determination using the impedance vectors. The method may include making the pass/fail determination by comparing each resistance component of the impedance vector with a corresponding allowable resistance range and by comparing each reactance component of the impedance vector with a corresponding allowable reactance range.

BRIEF DESCRIPTION OF THE DRAWINGS

The present invention is illustrated by way of example and is not limited by the accompanying figures in which like references indicate similar elements. Elements in the figures are illustrated for simplicity and clarity and have not necessarily been drawn to scale.

DETAILED DESCRIPTION

The inventors have recognized the need to provide an efficient and cost effective means for production testing of impedance of radio frequency (RF) printed circuit boards (PCBs). They have therefore developed a system and method of production testing of impedance of an RF circuit incorporated on PCBs as described herein. A test system includes a test computer and an RF tester, in which the RF tester further includes an RF source, a reflectometer, an RF probe for interfacing each device under test (DUT) which is one of many RF PCBs needing testing, and a parametric measurement system that controls the RF tester and interfaces the test computer. The RF source outputs one or more test frequencies applied to the DUT through a bidirectional coupler of the reflectometer. The bidirectional coupler outputs forward and reflected power signals to a gain/phase detector, which outputs voltage signals that are proportional to a measured reflection coefficient and that are provided to the parametric measurement system. The measured reflection coefficient may be converted to an impedance vector including a resistance component and a reactance component which may be compared by the test computer to allowable limits for a pass/fail determination.

The RF tester may incorporate measurement errors that may have an undesired effect on the pass/fail determination. A calibration kit including modified RF PCBs is created including a short circuit PCB or S PCB, an open circuit PCB or O PCB, and a loaded circuit PCB or L PCB with a predetermined load. Each of the SOL PCBs is measured using a network analyser or the like at one or more test frequencies to determine corresponding reference reflection coefficients that are stored in a reference table as part of the calibration kit. Each of the SOL PCBs are mounted to the RF tester, one at a time, to perform de-embedding testing at one or more of the test frequencies to generate test reflection coefficients. The test reflection coefficients values are those determined using the RF tester. The test and reference reflection coefficients are then used to calculate error values that are stored in an error value memory. Then during production testing, measured reflection coefficients are corrected to actual reflection coefficients by the test computer using the error values, and then the actual reflection coefficients are converted to impedance values for comparison with allowable limits for the pass/fail determination.

Figure 1:
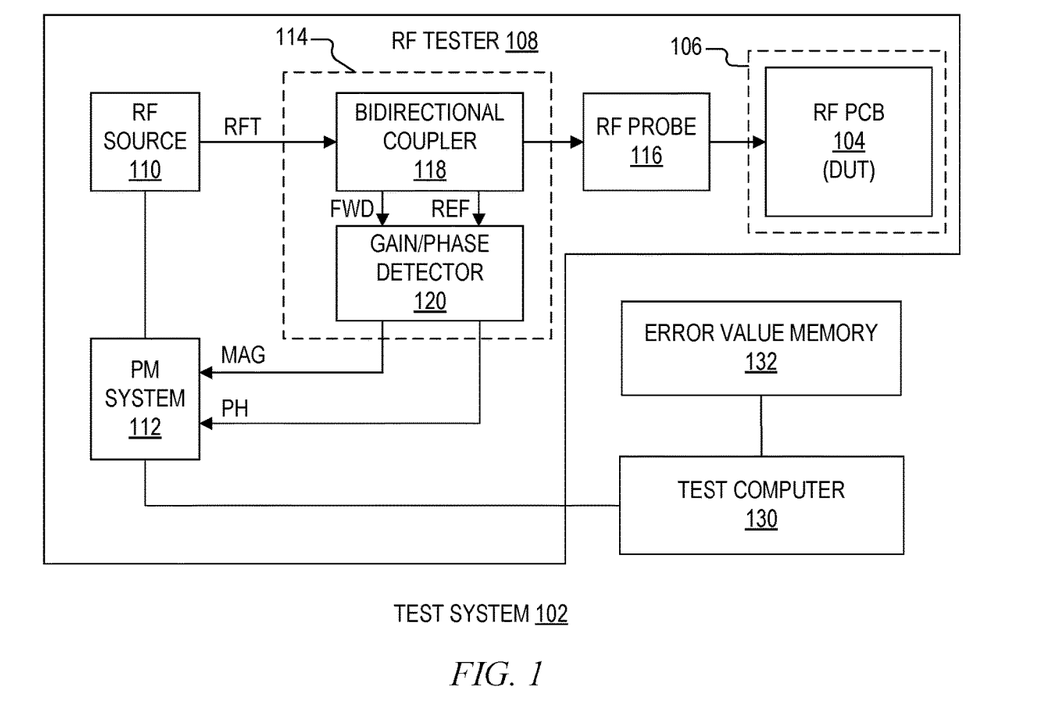
FIG. 1 is a simplified block diagram of a test system implemented according to one embodiment of the present disclosure for testing a mounted RF PCB as a device under test (DUT).

FIG. 1 is a simplified block diagram of a test system 102 implemented according to one embodiment of the present disclosure for testing a mounted RF PCB 104 as a device under test (DUT). The RF PCB 104 is only one of many RF PCBs for testing, each being the DUT when mounted to the test system 102. The test system 102 includes an RF tester 108, a test computer 130, and an error value memory 132. The RF tester 108 includes a mounting interface 106 in the form of one or more connectors or a platform with connectors or other mounting mechanism for electrically interfacing the RF PCB 104. Although not specifically shown, the RF tester 108 may provide power to activate the RF PCB 104 during testing. In one embodiment, the RF PCB 104 is placed into a low power receiver mode during testing and is not placed into its radiated mode meaning that there is no need for placing it in a transmitting (or radiated) mode during any portion of the test operation. The RF tester 108 further includes an RF source 110 and a parametric measurement (PM) system 112. The test system 102 further includes a reflectometer 114 and an RF probe 116. In one embodiment, the reflectometer 114 incorporates a bidirectional coupler 118 and a gain/phase detector 120.

The bidirectional coupler 118 and the gain/phase detector 120 may be discretely designed and implemented. Alternatively, in another embodiment the reflectometer 114 may be implemented by the AD8302 Series RF Detector manufactured by Analog Devices, Inc., along with supporting circuitry. The RF probe 116 may be manufactured by Ingun Corporation, although alternative RF probes may be used.

The RF source 110 generates and outputs an RF test (RFT) signal to the bidirectional coupler 118. In one embodiment, the RFT signal is a continuous wave (CW) signal at or near an RF frequency of operation of the RF PCB 104. In one embodiment, for example, the RF PCB 104 operates at approximately 2.4 GHz. In a more specific configuration, the RF source 110 may be configured to generate multiple discrete RF frequencies at or near the operating frequency range. The RFT signal is output to the bidirectional coupler 118, which forwards power of the RFT signal to the RF PCB 104 via the RF probe 116 electrically interfaced with an intermediate RF node 216 (FIG. 2) on the RF PCB 104. A reflected signal from the RF PCB 104 is generated back through the RF probe 116 to the bidirectional coupler 118, which outputs a forward (FWD) power signal and a reflected (REF) power signal to corresponding inputs of the gain/phase detector 120. The FWD power signal the same as or indicative of (e.g., proportional to) the RFT signal and the REF power signal is indicative of the signal reflected from the RF PCB 104 in response to the RFT signal.

The gain/phase detector 120 of the reflectometer 114 outputs a corresponding measured reflection coefficient $\Gamma_M$ to the PM system 112 indicative of a power ratio of and phase differential between the FWD and REF power signals as detected or otherwise measured by the test system 102. In one embodiment, the measured reflection coefficient is in polar form including a magnitude (MAG) value which represents a power ratio of the magnitude of the REF power signal divided by the magnitude of the FWD power signal, and a phase value (PH) which represents a phase differential between the FWD and REF power signals. In one embodiment, the MAG and PH values are represented as direct current (DC) voltages having a voltage level proportional to the magnitude and phase of the measured reflection coefficient $\Gamma_M$.

The MAG and PH values are provided to respective inputs of the PM system 112. Although not shown, the PM system 112 may include at least one analog to digital converter (ADC), a microcontroller unit, flash memory and firmware that digitizes the MAG and PH voltages and provides the digitized values to the test computer 130 for further processing. The PM system 112 and the test computer 130 may collectively be referred to as a test measurement system. In one embodiment, the test computer 130 may determine whether the measured reflection coefficient $\Gamma_M$ is within an allowable range of values for a pass/fail determination. For example, the MAG component may be compared with a corresponding magnitude pass range and the PH component may be separately compared with a corresponding phase pass range for making the pass/fail determination. In another embodiment, the MAG/PH polar value may first be converted into rectangular format including a real value (R) and an imaginary value (I) having the form R+jI. Then the measured reflection coefficient may be converted into an impedance vector $Z_M$ according to the following equation (1):

$$Z_M = Z_0(1+\Gamma_M)/(1+\Gamma_M) = R_M + jX_M \qquad (1)$$

in which $Z_0$ is a characteristic impedance of RF PCB 104, which in one embodiment is equal to 50 Ohms ($\Omega$), $R_M$ is a resistance component and $X_M$ is a reactance component. The $R_M$ and $X_M$ values may be separately compared with a corresponding resistance pass range and a corresponding reactance pass value range, respectively, for making the pass/fail determination.

Although not specifically shown, the portion coupling the reflectometer 114 with the RF probe 116 includes cables, connectors, and test fixture hardware that may add error to the measurement, including error in measurement by the reflectometer 114. The measured reflection coefficient $\Gamma_M$ received by the PM circuit 112 may not directly reflect an actual reflection coefficient $\Gamma_A$ at the RF PCB 104. Such error may result in a passing determination of an RF PCB that would otherwise fail, or a failing determination of an RF PCB that would otherwise pass.

As described further herein, a calibration process is performed using a calibration kit 608 (FIG. 6) which further includes modified test RF PCBs with known characteristics for determining a set of error values. The error values are stored in an error value memory 132 interfaced with the test computer 130. The error value memory 132 is shown as part of the test system 102, although it may be incorporated within the test computer 130 or it may be a memory device separate from the test system 102 yet accessible to the test computer 130 during testing. The error value memory 132 may be implemented as any type of non-volatile programmable memory, such as an electrically erasable programmable read-only memory (EEPROM) or the like. The test system 102 uses the error values to translate each measured reflection coefficient $\Gamma_M$ into a corresponding actual reflection coefficient $\Gamma_A$ which may then be used for making a more accurate pass/fail determination as further described herein.

Once the calibration process is performed and the error values determined, then the test system 102, such as the computer system 130, may determine whether the actual reflection coefficient $\Gamma_A$ is within an allowable range of values for a pass/fail determination. Although the actual reflection coefficient $\Gamma_A$ may be expressed in polar format, the reflection coefficients may be further converted to rectangular format (e.g., R+jI). Then the real component may be compared with a corresponding real component pass range and the imaginary component may be separately compared with a corresponding imaginary component pass range for making the pass/fail determination. Instead, the actual reflection coefficient $\Gamma_A$ may be converted into an impedance vector $Z_L$ according to the following equation (2):

$$Z_A = Z_0(1+\Gamma_A)/(1+\Gamma_A) - R_A + jX_A \qquad (2)$$

which is substantially similar to equation (1) except using the actual reflection coefficient $\Gamma_A$ rather than the measured reflection coefficient $\Gamma_M$ for a more accurate pass/fail determination. The $R_A$ and $X_A$ actual values may then be separately compared with the corresponding resistance pass range and the corresponding reactance pass value range, respectively, for making the pass/fail determination.

Figure 2:
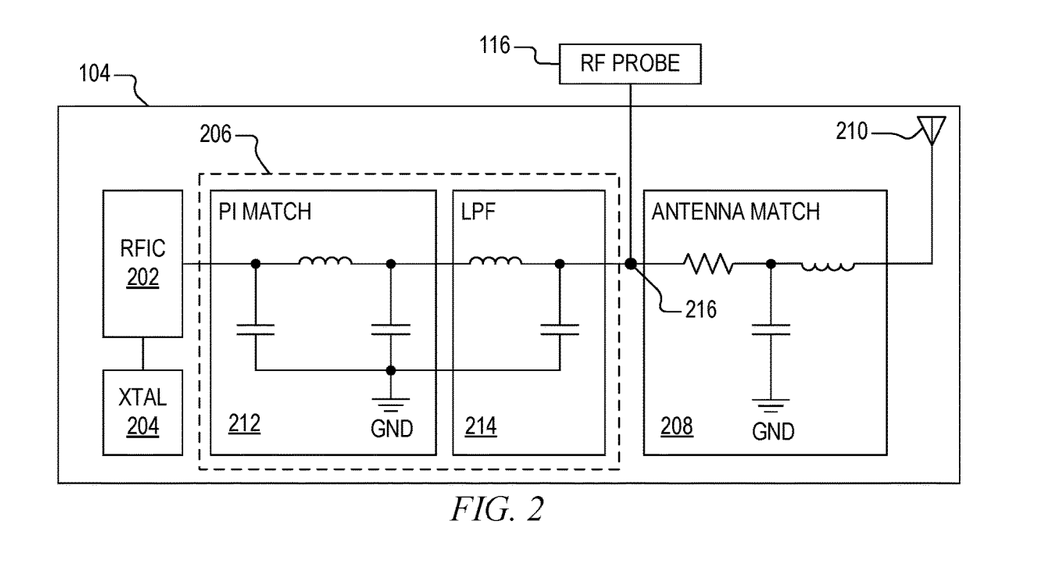
FIG. 2 is a simplified schematic and block diagram of an exemplary embodiment of the RF PCB as the DUT interfacing the RF probe of FIG. 1 according to one embodiment of the present disclosure.

FIG. 2 is a simplified schematic and block diagram of an exemplary embodiment of the RF PCB 104 as the DUT interfacing the RF probe 116 according to one embodiment of the present disclosure. The RF PCB 104 includes RF integrated circuit (RFIC) 202, a crystal (XTAL) 204, an IC matching circuit 206, an antenna matching circuit 208, and an antenna 210, all mounted on a PCB or the like. The RFIC 202 integrates an RF front end (not shown) and digital circuitry portions (not shown) of an RF transceiver implemented according to any particular RF technology or architecture and is not further described. The RFIC 202 may be configured, for example, as a Bluetooth® transceiver, a Wi-Fi transceiver, a ZigBee transceiver, a Z-Wave transceiver, etc. The XTAL 204 interfaces the RFIC 202 incorporating a crystal amplifier or the like (not show) for driving the XTAL 204 to oscillate at a predetermined frequency used for establishing RF communications. In one embodiment, for example, the RF PCB 104 operates in the 2.4 GHz frequency range, although other frequency ranges are contemplated, such as the sub-gigahertz frequency range, the 5 GHz range, etc.

The IC matching circuit 206 may include an LC PI-match circuit 212 and a LC low-pass filter (LPF) 214 each referenced to a common voltage reference node of the PCB referred to as ground (GND). GND may have any suitable voltage level greater than, equal to or less and 0 Volts (V).

Although specific details of an exemplary embodiment are shown in FIG. 2, these particular details of the PI-match circuit 212 and the LPF 214 are not further described except that each may typically include a combination of one or more inductors and one or more capacitors. The RFIC 202 has an RF interface coupled to one terminal of the PI-match circuit 212 which is further coupled to one or more terminals of the LPF 214. The LPF 214 has a terminal coupled to the intermediate RF node 216, which is further coupled to a terminal of the antenna matching circuit 208. Also, the particular details of the antenna matching circuit 208 are not further described except that it may typically include a combination of one or more inductors, one or more capacitors, and one or more resistors. The antenna matching circuit 208 includes another terminal coupled to the antenna 210. The RF probe 116 electrically interfaces the intermediate RF node 216 for purposes of testing the RF PCB 104 as further described herein.

During normal operation of the RF PCB 104, the RFIC 202 outputs an electrical RF signal for wireless transmission by the antenna 210. Also, RF signals transmitted by another RF transmitter (not shown) received by the antenna 210 are provided to the RFIC 202 for processing. The IC matching circuit 206 and the antenna matching circuit 208 are intended to provide suitable matching with the antenna 210 to maximize RF reception and transmission. The RF testing as described herein is particularly advantageous to determine problems with any of the IC matching circuit 206, the antenna matching circuit 208, or the antenna 210.

Figure 3:
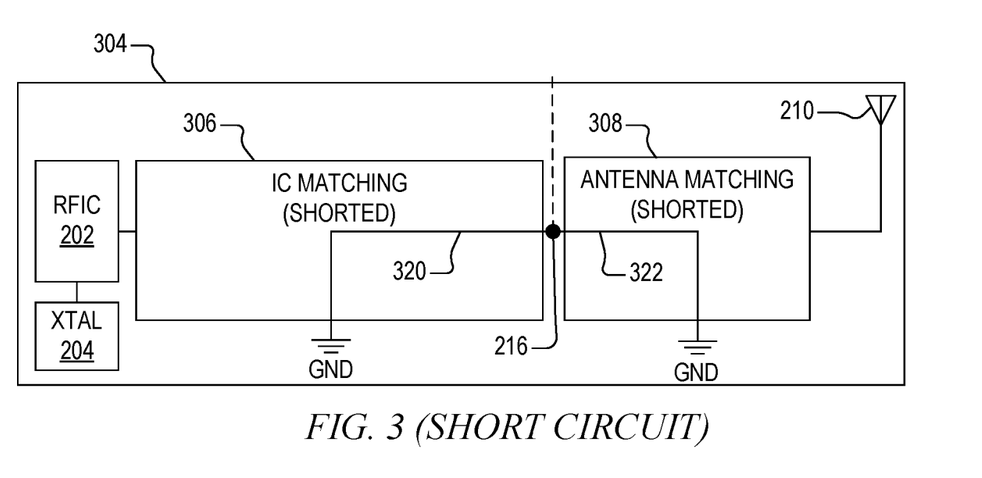
FIG. 3 is a simplified block diagram of short circuit or "S" PCB implemented according to one embodiment of the present disclosure as part of a calibration kit used for calibrating the test system of FIG. 1.

FIG. 3 is a simplified block diagram of short circuit or "S" PCB 304 implemented according to one embodiment of the present disclosure as part of the calibration kit 608 (FIG. 6) used for calibrating the test system 102. The S PCB 304 is an RF PCB that is similar to the RF PCB 204 except modified as a "short circuit" RF PCB. The RFIC 202, the XTAL 204, the intermediate RF node 216, and the antenna 210 are included and coupled in substantially similar manner on the S PCB 304. The IC matching circuit 206, however, is replaced by a shorted IC matching circuit 306 and the antenna matching circuit 208 is replaced by a shorted antenna matching circuit 308. The shorted IC matching circuit 306 may be configured in a substantially similar manner as the IC matching circuit 206, except that it is modified to include a conductive link 320 that shorts the terminal coupled to the intermediate RF node 216 directly to GND. Similarly, the shorted antenna matching circuit 308 may be configured in a substantially similar manner as the antenna matching circuit 208, except that it is modified to include a conductive link 322 that shorts the terminal coupled to the intermediate RF node 216 directly to GND.

Figure 4:
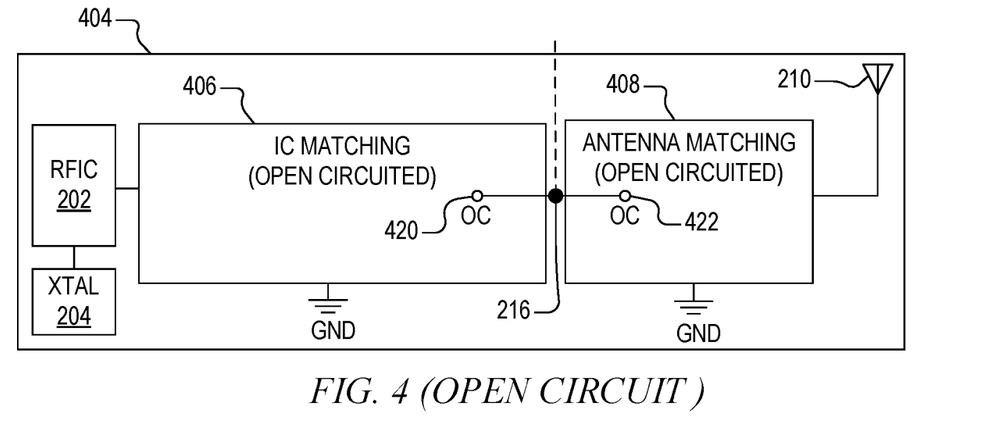
FIG. 4 is a simplified block diagram of an open circuit or "O" PCB implemented according to one embodiment of the present disclosure as part of the calibration kit used for calibrating the test system of FIG. 1.

FIG. 4 is a simplified block diagram of an open circuit or "O" PCB 404 implemented according to one embodiment of the present disclosure as part of the calibration kit 608 used for calibrating the test system 102. The O PCB 404 is similar to the RF PCB 204 except modified as an "open circuit" RF PCB. The RFIC 202, the XTAL 204, the intermediate RF node 216, and the antenna 210 are included and coupled in substantially similar manner. The IC matching circuit 206, however, is replaced by an open circuited IC matching circuit 406 and the antenna matching circuit 208 is replaced by an open circuited antenna matching circuit 408. The open circuited IC matching circuit 406 may be configured in a substantially similar manner as the IC matching circuit 206, except that it is modified so that the terminal coupled to the intermediate RF node 216 is coupled to a node 420 that is open circuited, meaning that it is not coupled to any other circuitry of the RF PCB. Similarly, the open circuited antenna matching circuit 408 may be configured in a substantially similar manner as the antenna matching circuit 208, except that it is modified so that the terminal coupled to the intermediate RF node 216 is coupled to a node 422 that is open circuited, meaning that it is not coupled to any other circuitry of the RF PCB.

Figure 5:
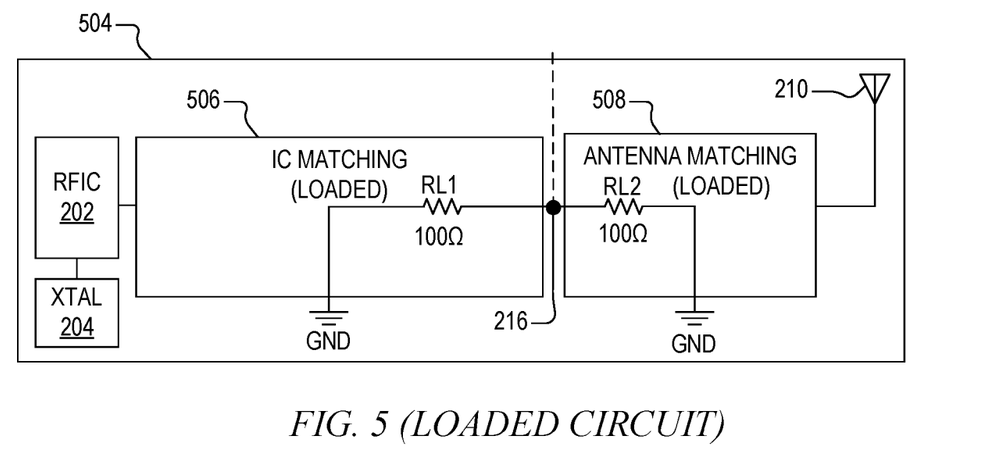
FIG. 5 is a simplified block diagram of a loaded circuit or "L" PCB implemented according to one embodiment of the present disclosure as part of the calibration kit used for calibrating the test system of FIG. 1.

FIG. 5 is a simplified block diagram of a loaded circuit or "L" PCB 504 implemented according to one embodiment of the present disclosure as part of the calibration kit 608 used for calibrating the test system 102. The L PCB 504 is similar to the RF PCB 204 except modified as a "loaded" RF PCB. The RFIC 202, the XTAL 204, the intermediate RF node 216, and the antenna 210 are included and coupled in substantially similar manner. The IC matching circuit 206, however, is replaced by a loaded IC matching circuit 506 and the antenna matching circuit 208 is replaced by a loaded antenna matching circuit 508. The loaded IC matching circuit 506 may be configured in a substantially similar manner as the IC matching circuit 206, except that it is modified to include a load resistor RL1 coupled between the intermediate RF node 216 and GND so that the intermediate RF node 216 only "sees" the load resistor RL1 and is not coupled to any other circuitry in the loaded IC matching circuit 506. Similarly, the loaded antenna matching circuit 508 may be configured in a substantially similar manner as the antenna matching circuit 208, except that it is modified to include a load resistor RL2 coupled between the intermediate RF node 216 and GND so that the intermediate RF node 216 only "sees" the load resistor RL2 and is not coupled to any other circuitry in the loaded antenna matching circuit 508.

The resistance values of the resistors RL1 and RL2 of the L PCB 504 are predetermined and known so that the effective load during the calibration process is known. In one embodiment, the resistance values of the resistors RL1 and RL2 both equal to 100Ω, so that the effective load applied at the RF probe 116 during the calibration process is 50Ω (since RL1 and RL2 are effectively coupled in parallel). Alternative resistance values are contemplated in different configurations.

The S, O, and L PCBs 304, 404, and 504 (collectively referred to herein as the SOL PCBs) are part of the calibration kit 608 implemented according to one embodiment of the present disclosure that are used for calibrating the test system 102. As previously discussed, a calibration process is performed using the calibration kit 608 including modified test RF PCBs with known characteristics for determining the set of error values that are stored in the error value memory 132. Each of the SOL PCBs includes the intermediate RF node 216 with a dashed line representing an interface to the RF probe 116 when used during the calibration process.

Figure 6:
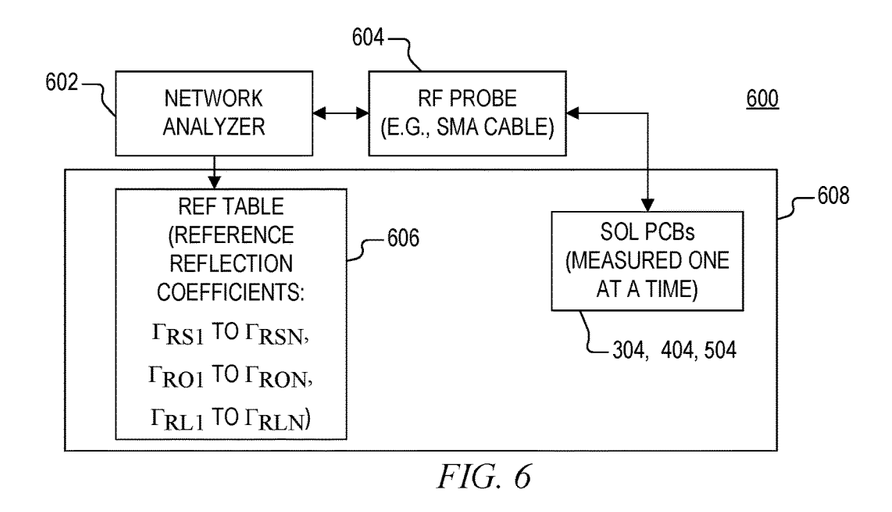
FIG. 6 is a simplified block diagram of a test apparatus used for measuring and storing reference reflection coefficients for each of the SOL PCBs of the calibration kit using a network analyzer or the like according to one embodiment of the present disclosure.

FIG. 6 is a simplified block diagram of a test apparatus 600 used for measuring and storing reference reflection coefficients (or reference reflection coefficients) for each of the SOL PCBs of the calibration kit 608 using a network analyzer 602 or the like according to one embodiment of the present disclosure. The network analyzer 602 interfaces each of the SOL PCBs 304, 404, and 504, one at a time, using a corresponding RF probe 604. The network analyzer 602 may be a vector network analyzer (VNA) or a scalar network analyzer (SNA) or the like. The RF probe 604 may be the same or similar to the 116, but for more accurate measurement, may be in the form of an RF SMA connector or the like. Measured reflection coefficients are converted to a set of reference reflection coefficients that are stored in a reference (REF) table 606 which is also part of the calibration kit 608.

The test apparatus 600 is used only once for measuring the corresponding reflection coefficients that are used as or otherwise converted to corresponding reference reflection coefficients of each of the SOL PCBs. During the test of each SOL PCB, the network analyzer 602 applies one or more RF frequencies in the applicable frequency range to the SOL PCB and measures reflection coefficients that are converted to corresponding reference reflection coefficients $\Gamma_{RS}$, $\Gamma_{RO}$, and $\Gamma_{RL}$, which are recorded or stored in the REF table 606. Although it is possible to apply only one frequency, it may be desired to apply a set of "N" frequencies that are less than, equal to, and greater than the particular frequency of operation of the RF PCB 104. In one embodiment for a 2.4 GHz RF configuration, the network analyzer 602 applies 101 different frequencies from 2.2 GHz to 2.7 GHz in 5 Megahertz (MHz) increments to each SOL PCB. Thus, the REF table 606 includes a corresponding reference reflection coefficient for each frequency of the entire set of N frequencies for each of the 3 SOL PCBs. Assuming N frequencies, the REF table 606 stores a first set of reference reflection coefficients $\Gamma_{RS1}$, $\Gamma_{RS2}$, ..., $\Gamma_{RSN}$ ($\Gamma_{RS1}$ to $\Gamma_{RSN}$) for the S PCB 304, stores a second set of reference reflection coefficients $\Gamma_{RO1}$, $\Gamma_{RO2}$, ..., $\Gamma_{RON}$ ($\Gamma_{RO1}$ to $\Gamma_{RON}$) for the O PCB 404, and stores a third set of reference reflection coefficients $\Gamma_{RL1}$, $\Gamma_{RL2}$, ..., $\Gamma_{RLN}$ ($\Gamma_{RL1}$ to $\Gamma_{RLN}$) for the L PCB 504.

The actual output of the network analyzer 602 may be in polar form including a magnitude value and a corresponding phase value. In one embodiment, the magnitude value is a logarithmic value measured in decibels (dB) and the phase value is measured in degrees. When in logarithmic format, the magnitude of each measured reflection coefficient may first be converted to linear format, and then the linear polar value is converted to the rectangular format (e.g., R+Ij) as the final reference reflection coefficient. It is noted that the reference reflection coefficients may be stored in any one of these formats (logarithmic, linear, rectangular) and converted to an appropriate form when used as further described herein.

The calibration kit 608 includes the set of SOL PCBs 304, 404, and 504 and the corresponding REF table 606 storing the corresponding reference reflection coefficients that were measured for the particular set of SOL PCBs using a particular test system 102. Additional SOL PCB sets may be fabricated, and for each new SOL PCB set, the test apparatus 600 is used for a given test system 102 to determine the corresponding reference reflection coefficients that correspond to the new SOL PCB set.

Figure 7:
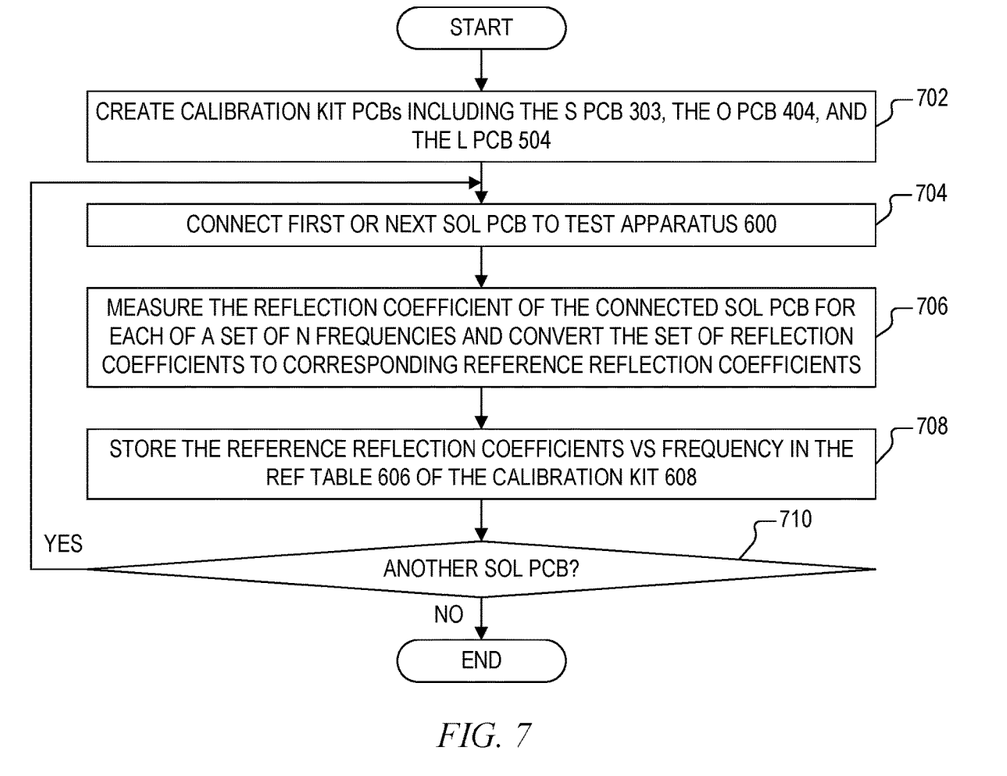
FIG. 7 is a flowchart diagram of the first portion of the calibration process for creating the SOL PCBs of the calibration kit, and then generating and storing the reference reflection coefficients into the REF table using the test apparatus of FIG. 6 according to one embodiment of the present disclosure to complete the calibration kit.

FIG. 7 is a flowchart diagram of the first portion of the calibration process for creating the SOL PCBs of the calibration kit 608, and then generating and storing the reference reflection coefficients into the REF table 606 using the test apparatus 600 according to one embodiment of the present disclosure to complete the calibration kit 608. At a first step 702, each of the SOL PCBs 304, 404, and 504 of the calibration kit 608 are created. The S PCB 304 is created by modifying a standard RF PCB (e.g., 204 shown in FIG. 2) with the conductive links 320 and 322 to effectively short the intermediate RF node 216 to GND in both the IC and antenna matching circuits. The O PCB 404 is created by modifying a standard RF PCB (e.g., 204 shown in FIG. 2) by connecting the intermediate RF node 216 to open circuit nodes 420 and 422 in both the IC and antenna matching circuits. The L PCB 504 is created by modifying a standard RF PCB (e.g., 204 shown in FIG. 2) by adding a known load (e.g., 100Ω resistor) in both the IC and antenna matching circuits.

At next block 704, the first or next one of the SOL PCBs 304, 404, 504 is connected to the test apparatus 600, in which the SOL PCBs are measured one at a time and may be measured in any order. At next block 706, the reflection coefficient of the connected SOL PCB is measured using the test apparatus 600 for each of the N frequencies in the applicable frequency range of interest. The set of reflection coefficients are then converted to the reference reflection coefficients depending upon the desired format of the reference reflection coefficients. At next block 708, the measured reference reflection coefficients are stored into the REF table 606 organized by SOL PCB and by corresponding frequency (e.g., N reference reflection coefficients provided for each SOL PCB). At next block 710, it is queried whether another SOL PCB is to be measured and if so, operation loops back to block 704 to repeat the process for the next SOL PCB. The reference reflection coefficients are measured for each of the SOL PCBs, one at a time, and then operation is completed. The REF table 606 stores a first set of N reference reflection coefficients $\Gamma_{RS1}$ to $\Gamma_{RSN}$ for the S PCB 304, a second set of N reference reflection coefficients $\Gamma_{RO1}$ to $\Gamma_{RON}$ for the O PCB 404, and a third set of N reference reflection coefficients $\Gamma_{RL1}$ to $\Gamma_{RLN}$ for the L PCB 504.

Figure 8:
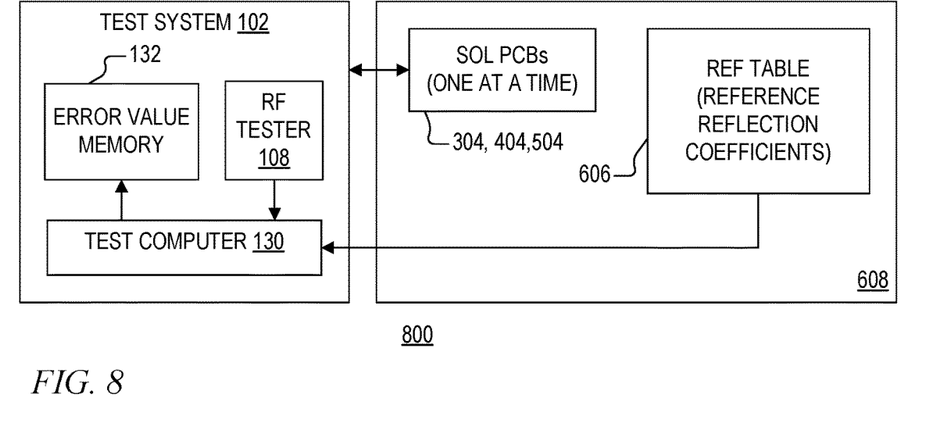
FIG. 8 is a simplified block diagram of a test apparatus that performs an RF de-embedding process using the test system of FIG. 1 and the calibration kit of FIG. 6 to determine and to store the error values into the error value memory of FIG. 1 for calibrating the test system according to one embodiment of the present disclosure.

FIG. 8 is a simplified block diagram of a test apparatus 800 that performs an RF de-embedding process using the test system 102 and the calibration kit 608 to determine and to store the error values into the error value memory 132 for calibrating the test system 102 according to one embodiment of the present disclosure. Each of the SOL PCBs 304, 404, and 504 is placed into the mounting interface 106 of the RF tester 108, one PCB at a time, during the RF de-embedding process. A set of M frequencies are generated by the RF source 110 and applied to the mounted SOL PCB, and the corresponding MAG and PH values are read and possibly converted by the PM system 112 into test reflection coefficients that are provided to the test computer 130. Test reflection coefficients are those measured by a particular RF tester 108. The set of "M" frequencies may be the same as the set of N frequencies used by the test apparatus 600 or a subset thereof. The process is repeated for each SOL PCB, and then the test computer 130 uses the test reflection coefficients and the reference reflection coefficients to calculate the error values. The test computer 130 then programs the error value memory 132.

In the illustrated embodiment, the test computer 130 is used to calculate and store the error values into the error value memory 132 of the test system 102. The RF de-embedding process is performed only once for each test set up to test one or more RF PCBs 104. The use of the test computer 130 simplifies the PM system 112 for performing pass/fail analysis of the one or more RF PCBs 104. In an alternative embodiment, the separate test computer 130 may be eliminated (or otherwise simplified) in which the functions of calculating and storing the error values into the error value memory 132 may be incorporated into the PM system 112.

Figure 9:
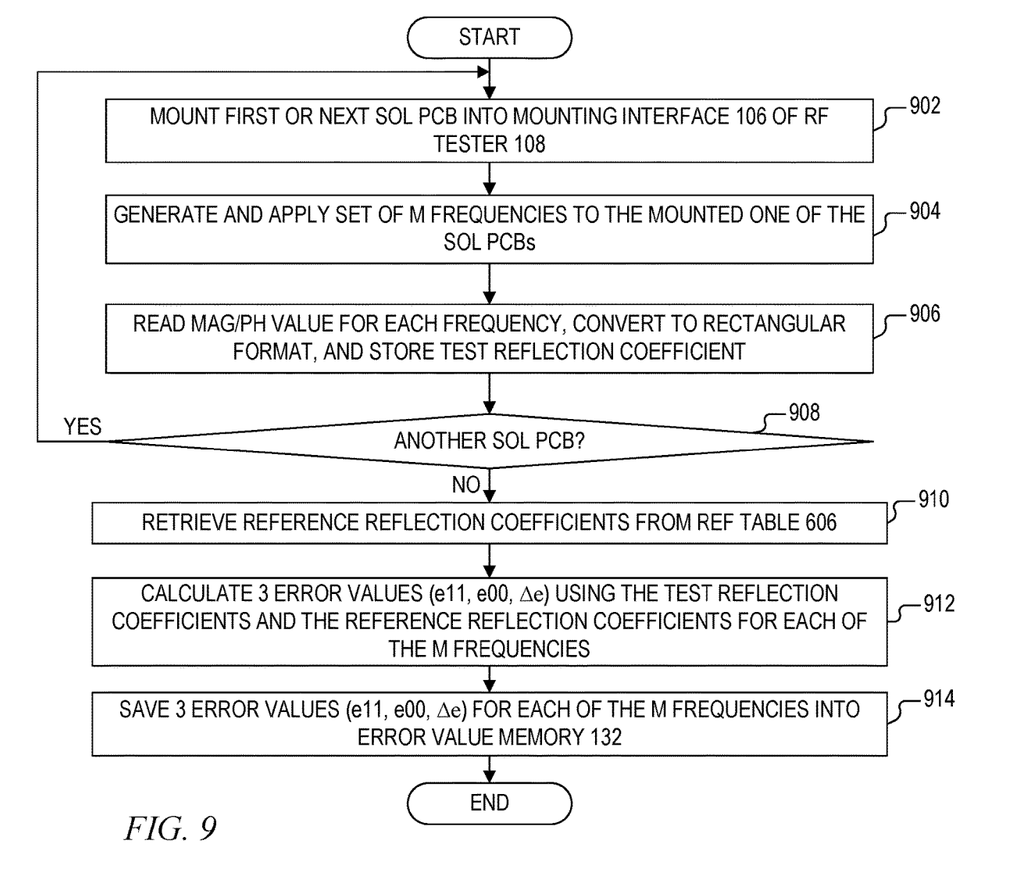
FIG. 9 is a flowchart diagram of the RF de-embedding process portion of the calibration process for calculating and storing the error values into the error value memory of FIG. 1 using the test apparatus of FIG. 8 according to one embodiment of the present disclosure.

FIG. 9 is a flowchart diagram of the RF de-embedding process portion of the calibration process for calculating and storing the error values into the error value memory 132 using the test apparatus 800 according to one embodiment of the present disclosure. At a first block 902, the first or next one of the SOL PCBs 304, 404, and 504 is mounted to the test system 102 via the mounting interface 106. At next block 904, the RF source 110 outputs M frequencies, one at a time, and the corresponding reflection coefficients in the form of the MAG and PH values are output from the reflectometer 114 and provided to the PM system 112. At next block 906, the MAG/PH values for each frequency are read, converted to rectangular format, and stored as a test reflection coefficient by the test computer 130 (or by the PM system 112). At next block 908 it is queried whether there is another one of the 3 SOL PCBs to be measured, in which operation loops back to block 902 for each successive SOL PCB until all of the PCBs are measured.

Operation is repeated for each of the SOL PCBs 304, 404, and 504. In this manner, for each of M frequencies applied to the S PCB 304, a corresponding MAG/PH output from the reflectometer 114 is converted by the PM circuit 112 into a corresponding test reflection coefficient to achieve a set of M test reflection coefficients $\Gamma_{TS1}$, $\Gamma_{TS2}$, ..., $\Gamma_{TSM}$ ($\Gamma_{TS1}$ to $\Gamma_{TSM}$). The process is repeated for the O PCB to achieve a set of M reflection coefficients ($\Gamma_{TO1}$ to $\Gamma_{TOM}$) for the O PCB 404. Finally the process is repeated for the L PCB to achieve a set of M test reflection coefficients ($\Gamma_{TL1}$ to $\Gamma_{TLM}$) for the L PCB 504.

In this case during calibration, the MAG/PH output of the reflectometer 114 is referred to as a reflection coefficient that may be converted to rectangular format for each measurement. After the measurements for each of the SOL PCBs are converted and stored by the test computer 130 (or by the PM system 112), at next block 910 the REF table 606 is accessed to retrieve the corresponding set of reference reflection coefficients. At next block 912, the test computer 130 (or the PM system 112) calculates 3 error values e00, e11, and Δe using the test reflection coefficients and the reference reflection coefficients for each of the M frequencies as described further herein. At last block 914, the calculated error values e00, e11, and Δe are stored into the error value memory 132 vs frequency for each of the M frequencies, and operation is completed.

The M frequencies of the RF de-embedding process may be the same as the N frequencies used for measuring the SOL PCBs or a subset thereof. In one embodiment, M is a selected subset of N in which the larger number N provides flexibility to change the frequency scheme for the de-embedding process without having to re-measure the reflection coefficients of the SOL PCBs. In one embodiment, M=23 including frequencies 2.395 GHz to 2.505 GHz in 5 MHz increments, in which each of the M frequencies of the subset are selected from the larger set of N frequencies.

The following equation (3) is an expression that applies for the S PCB 304 for determining the error values e00, e11, and Δe using corresponding reference and test reflection coefficients for a given frequency:

$$e00 + \Gamma_{RSi}\Gamma_{TSj}e11 - \Gamma_{RSi}\Delta e = \Gamma_{TSj} \qquad (3)$$

where "e00" is a directivity error, e11 is a port match error, Δe=e00(e11)(e10e01) in which (e10e01) is a tracking error, "i" is an index for the N reference reflection coefficients and "j" is an index for the M test reflection coefficients. Although the indices i and j may be different for a given equation, they refer to the same frequency. For example, if N=101 for frequencies from 2.2 GHz to 2.7 GHz in 5 MHz increments, and if M=23 for frequencies 2.395 GHz to 2.505 GHz in 5 MHz increments, then i=41 and j=2 for the frequency 2.4 GHz. In a similar manner, the following equation (4) is an expression that applies for the O PCB 404 for determining the error values e00, e11, and Δe using corresponding reference and test reflection coefficients for a given frequency:

$$e00 + \Gamma_{ROi}\Gamma_{TOj}e11 - \Gamma_{ROi}\Delta e = \Gamma_{TOj} \qquad (4)$$

and the following equation (5) is an expression that applies for the L PCB 504 for determining the error values e00, e11, and Δe using corresponding reference and test reflection coefficients for a given frequency:

$$e00 + \Gamma_{ROi}\Gamma_{TOj}e11 - \Gamma_{ROi}\Delta e = \Gamma_{TOj} \quad (5)$$

In the 3 equations (3), (4), and (5), the test and reference reflection coefficients are measured for each frequency and the error values e00, e11, and Δe are the 3 unknowns. Since there are 3 equations with 3 unknowns, the error values e00, e11, and Δe may be calculated for each frequency. In brief summary, the reference reflection coefficients are the raw reflection coefficients measured for the SOL PCBs by a network analyzer or the like presumably with little error. These calibration PCBs have known load characteristics, so when mounted to and measured by the test system 102, the test reflection coefficients incorporate any measurement errors introduced by the RF tester 108. The test and reference reflection coefficients can then be used to determine the error values which characterize the measurement error of the RF tester 108. Thus, actual RF PCBs 104 as DUT of the RF tester 108 of the test system 102 can be more accurately evaluated by translating measured reflection coefficients into actual reflection coefficients using the error values.

Figure 10:
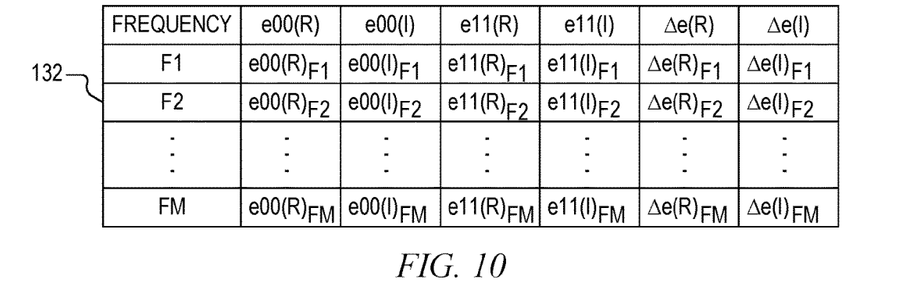
FIG. 10 is a simplified block diagram of one embodiment of the error value memory of FIG. 1 storing error values for M different frequencies.

FIG. 10 is a simplified block diagram of one embodiment of the error value memory 132 storing the error values e00, e11 and Δe in rectangular format for M different frequencies. Each error value includes a real value (R) and an imaginary value (I) for each one of M frequencies. Thus, the e00 value includes a real value shown as e00(R) and an imaginary value e00(I) for each of the M frequencies F1 to FM, the e11 value includes a real value shown as e11(R) and an imaginary value e11(I) for each of the M frequencies F1 to FM, and the Δe value includes a real value shown as Δe(R) and an imaginary value Δe(I) for each of the M frequencies F1 to FM.

Figure 11:
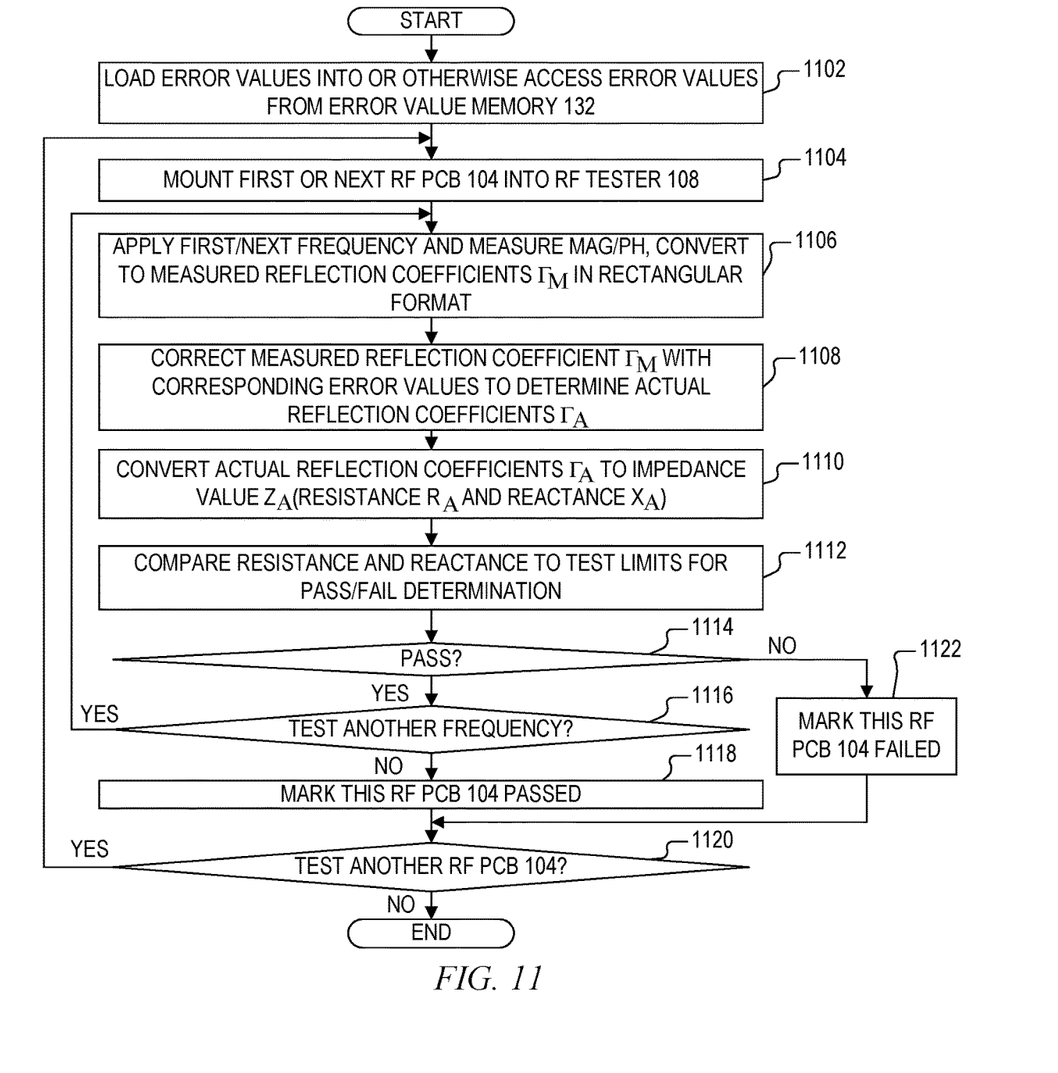
FIG. 11 is a flowchart diagram of actual production testing of one or more RF PCBs using the test system of FIG. 1 according to one embodiment of the present disclosure.

FIG. 11 is a flowchart diagram of actual production testing of one or more RF PCBs 104 using the test system 102 according to one embodiment of the present disclosure. At a first block 1102, the error values are loaded into the error value memory 132 if not already loaded or otherwise the error values are accessed from the error value memory 132. It is noted that in an alternative embodiment, the error values may be stored in the test computer 130 or some other location rather than being programmed directly into the error value memory 132. At next block 1104, the first or next of one or more RF PCBs 104 to be tested is mounted to the RF tester 108 as the DUT for testing. At next block 1106, the RF tester 108 is operated to apply a first or next frequency that results in an RF comparison value in the form of MAG/PH provided to the PM system 112, which is converted to a measured reflection coefficient $\Gamma_M$ in rectangular format.

It is noted that the RF PCB 104 may be production tested at one or more of the M frequencies of the RF de-embedding process used to determine the error values. A significantly reduced number of frequencies, however, may be applied during production testing, such as a number P frequencies, so long as each of the P frequencies is same as a corresponding one of the M frequencies. In one embodiment, P=3 in which a selected 3 of the M frequencies are selected. In a more specific embodiment, the production test frequencies include 2.4 GHz, 2.45 GH, and 2.5 GHz. The larger number M of frequencies measured for the de-embedding process provides flexibility in selecting different frequencies for production testing without having to perform the RF de-embedding process again.

At next block 1108, the measured reflection coefficient $\Gamma_M$ is provided from the PM system 112 to the computer system 130 which converts the measured value to an actual reflection coefficient $\Gamma_A$ using the error values according to the following equation (6):

$$\Gamma_A = (\Gamma_M - e00)/((\Gamma_M e11 - \Delta e) \quad (6)$$

in which the error values e00, e11, and Δe are retrieved from the error value memory 132 that correspond with the current frequency level being applied. At next block 1110, the actual reflection coefficient $\Gamma_A$ is converted to an impedance vector $Z_A$ according to equation (2) previously described to provide corresponding resistance and reactance components $R_A$ and $X_A$. At next block 1112, the computer system 130 compares each of the resistance $R_A$ and reactance $X_A$ with corresponding allowable test ranges or limits. The allowable test limits may be predetermined according to empirical testing or the like. It is noted that different allowable test ranges may be provided for each frequency value, so that each resistance component may be compared with an allowable resistance range determined for the corresponding frequency, and so that each reactance component may be compared with an allowable reactance range determined for the corresponding frequency.

At next block 1114, it is queried whether the RF PCB 104 passed at the current frequency level based on the separate resistance and reactance value comparisons. If so, operation proceeds to next block 1116 in which it is queried whether to test another frequency. As noted above, each RF PCB 104 may be tested at P frequencies during production testing, in which P is at least one. If the RF PCB 104 is to be tested at another frequency level, operation loops back to block 1106 to apply the next frequency. If the RF PCB 104 has been tested at each of the applicable frequencies without failing, then operation proceeds to next block 1118 in which the current RF PCB 104 is marked as passed. Operation then proceeds to next block 1120 to query whether another RF PCB 104 is to be tested. If so, operation loops back to block 1104 in which the next RF PCB 104 is mounted to the RF tester 108 for testing as the DUT, and the production test procedure is repeated for the next RF PCB 104. When there are no more RF PCBs 104 to be production tested, test operation is completed.

Referring back to block 1114, if the current RF PCB 104 fails production testing at any of the P production frequency levels, then operation proceeds instead to block 1122 in which the current RF PCB 104 is marked as failed. It is noted that other parameters may be recorded for the failed RF PCB, such as the frequency level in which it failed, the failing parameter (e.g., resistance or reactance or both), the margin of failure (e.g., the difference between the actual measured value and the passing range), etc. It is also noted that the production test procedure may be modified to test at each of the production frequencies even when a failure occurs at any one of the frequencies. The additional information may be useful in adjusting L, C, or R values of the matching circuits of the failed RF PCB to obtain subsequent passing of production testing.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A test system for testing a radio frequency (RF) printed circuit board (PCB), the RF PCB including an RF integrated circuit (RFIC), an IC matching circuit coupled between the RFIC and an intermediate node, and an antenna matching circuit coupled between the intermediate node and an antenna, the test system comprising:
   an RF probe for electrically interfacing the intermediate node of the RF PCB;
   an RF source providing an RF test signal;
   a reflectometer that transfers the RF test signal to the intermediate node via the RF probe, that detects a reflected RF signal from the RF probe, and that outputs a measured reflection coefficient indicative of a comparison between the reflected RF signal and the RF test signal; and
   a test measurement system that makes a pass/fail determination of the RF PCB using the measured reflection coefficient, wherein the test measurement system uses at least one error value to convert the measured reflection coefficient into an actual reflection coefficient, wherein the test measurement system converts the actual reflection coefficient into an impedance vector comprising a resistance value and a reactance value, and wherein the test measurement system makes the pass/fail determination by comparing the resistance value with an allowable resistance range and by comparing the reactance value with an allowable reactance range.

2. The test system of claim 1, wherein the reflectometer comprises:
   a bidirectional coupler that delivers RF power from the RF source to the RF probe and that provides a forward power signal indicative of the RF test signal and a reflected power signal indicative of the reflected RF signal; and
   a gain and phase detector coupled to the bidirectional coupler that provides the measured reflection coefficient as a magnitude value indicative of a power ratio of the reflected power signal and the forward power signal and a phase value indicative of a phase differential between the forward and reflected power signals.

3. The test system of claim 1, wherein the RF source provides a plurality of forward RF signals at a corresponding plurality of different frequencies for providing a corresponding plurality of measurement reflection coefficients, wherein the test measurement system uses at least one error value for each of the plurality of different frequencies to convert the plurality of measured reflection coefficients into a corresponding plurality of actual reflection coefficients, and wherein the test measurement system uses the plurality of actual reflection coefficients to make the pass/fail determination.

4. The test system of claim 3, wherein the at least one error value comprises a plurality of error values for each of the plurality of different frequencies, and wherein the plurality of error values are determined by a calibration procedure based on measurements taken for each of a plurality of test PCBs with known load conditions.

5. The test system of claim 4, wherein the plurality of test PCBs comprise a first test PCB with short circuit load, a second test PCB with an open circuit load, and a third test PCB with a predetermined resistive load.

6. The test system of claim 4, wherein each of the plurality of test PCBs are measured by a network analyzer at each of a set of frequencies including the plurality of different frequencies to determine a corresponding set of reference reflection coefficients for each of the plurality of test PCBs, wherein each of the plurality of test PCBs are also measured by the test system at a subset of the same set of frequencies to determine a corresponding set of test reflection coefficients for each of the plurality of test PCBs, and wherein each set of reference reflection coefficients and each set of test reflection coefficients are collectively used for determining the plurality of error values for each of the plurality of different frequencies.

7. The test system of claim 1, wherein the RF source provides a plurality of forward RF signals at a corresponding plurality of different frequencies for providing a corresponding plurality of measurement reflection coefficients, wherein the test measurement system uses at least one error value for each of the plurality of different frequencies to convert the plurality of measured reflection coefficients into a corresponding plurality of actual reflection coefficients, wherein the test measurement system converts each of the plurality of actual reflection coefficients into a corresponding one of a plurality of impedance vectors and uses the plurality of impedance vectors to make the pass/fail determination.

8. The test system of claim 7, wherein each of the plurality of impedance vectors comprises a resistance component and a reactive component and wherein the test measurement system makes the pass/fail determination by comparing each resistance component with a corresponding allowable resistance range and by comparing each reactance component with a corresponding allowable reactance range.

9. A method of testing a radio frequency (RF) printed circuit board (PCB), the RF PCB including an RF integrated circuit (RFIC), an IC matching circuit coupled between the RFIC and an intermediate node, and an antenna matching circuit coupled between the intermediate node and an antenna, the method comprising:
   electrically interfacing the intermediate node of the RF PCB using an RF probe;
   applying at least one RF test signal to the intermediate node via the RF probe;
   detecting a reflected RF signal from the RF PCB;
   providing a measured reflection coefficient indicative of a comparison between the reflected RF signal and the RF test signal;
   converting the measured reflection coefficient into an actual reflection coefficient using at least one error value;
   converting the actual reflection coefficient into an impedance vector which includes a resistance value and a reactance value; and
   making a pass/fail determination of the RF PCB using the measured reflection coefficient, including comparing the resistance value with an allowable resistance range and comparing the reactance value with an allowable reactance range.

10. The method of claim 9, wherein the providing a measured reflection coefficient comprises providing a magnitude value indicative of a power ratio of the reflected RF signal and the RF test signal and providing a phase value indicative of a phase differential between the RF test signal and the reflected RF signal.

11. The method of claim 9, further comprising:
applying a plurality of RF test signals at a corresponding plurality of different frequencies for providing a corresponding plurality of measurement reflection coefficients;
converting the plurality of measured reflection coefficients into a corresponding plurality of actual reflection coefficients using at least one error value for each of the plurality of different frequencies; and
making the pass/fail determination using the plurality of actual reflection coefficients.

12. The method of claim 11, further comprising performing a calibration procedure by taking measurements of each of a plurality of test PCBs with known load conditions to determine a plurality of error values for each of the plurality of different frequencies.

13. The method of claim 12, wherein the performing a calibration procedure comprises taking measurements of a first test PCB with a short circuit load, a second test PCB with an open circuit load, and a third test PCB with a predetermined resistive load.

14. The method of claim 12, further comprising:
measuring each of the plurality of test PCBs at each of a set of frequencies including the plurality of different frequencies using a network analyzer to determine a corresponding set of reference reflection coefficients for each of the plurality of test PCBs;
testing each of the plurality of test PCBs to provide a corresponding set of test reflection coefficients for each of the plurality of test PCBs, including electrically interfacing an intermediate node of each test PCB, applying a plurality of RF test signals at a subset of the same set of frequencies via the RF probe for each test PCB, and detecting a corresponding reflected RF signal for each test PCB; and
determining the plurality of error values for each of the plurality of different frequencies using the set of reference reflection coefficients the set of test reflection coefficients.

15. The method of claim 9, further comprising:
applying a plurality of RF test signals at a corresponding plurality of different frequencies for providing a corresponding plurality of measurement reflection coefficients;
converting the plurality of measured reflection coefficients into a corresponding plurality of actual reflection coefficients using at least one error value for each of the plurality of different frequencies;
converting each of the plurality of actual reflection coefficients into a corresponding one of a plurality of impedance vectors; and
making the pass/fail determination using the plurality of impedance vectors.

16. The method of claim 15, wherein each of the plurality of impedance vectors comprises a resistance component and a reactive component, and wherein the making the pass/fail determination comprises comparing each resistance component with a corresponding allowable resistance range and by comparing each reactance component with a corresponding allowable reactance range.

* * * * *